United States Patent
Yeh et al.

(10) Patent No.: US 8,179,143 B2
(45) Date of Patent: May 15, 2012

(54) APPARATUS FOR TESTING PRINTED CIRCUIT AND METHOD THEREFOR

(75) Inventors: Shang-Tsang Yeh, Jhonghe (TW); Chia-Ming Chen, Xizhi (TW)

(73) Assignee: Test Research, Inc., Taipei (TW)

( * ) Notice: Subject to any disclaimer, the term of this patent is extended or adjusted under 35 U.S.C. 154(b) by 828 days.

(21) Appl. No.: 12/251,892

(22) Filed: Oct. 15, 2008

(65) Prior Publication Data
US 2010/0090679 A1    Apr. 15, 2010

(51) Int. Cl.
G01R 31/08   (2006.01)
G01R 31/28   (2006.01)
G01R 31/04   (2006.01)
G01R 19/00   (2006.01)

(52) U.S. Cl. .......... 324/522; 324/763.01; 324/538; 702/64

(58) Field of Classification Search ........ 324/763.01, 324/754.21, 523, 522, 538; 702/64
See application file for complete search history.

(56) References Cited

U.S. PATENT DOCUMENTS

| | | |
|---|---|---|
| 3,590,378 A | 6/1971 | Kassabgi |
| 3,825,824 A | 7/1974 | Herron et al. |
| 3,870,953 A | 3/1975 | Boatman et al. |
| 3,975,680 A | 8/1976 | Webb |
| 4,196,386 A | 4/1980 | Phelps |
| 4,565,966 A | 1/1986 | Burr et al. |
| 4,894,605 A | 1/1990 | Ringlen et al. |
| 4,961,053 A | 10/1990 | Krug |
| 5,124,660 A | 6/1992 | Cilingiroglu |
| 5,138,266 A | 8/1992 | Stearns |
| 5,187,430 A | 2/1993 | Marek et al. |
| 5,254,953 A | 10/1993 | Crook et al. |
| 5,256,975 A | 10/1993 | Mellitz et al. |
| 5,268,645 A | 12/1993 | Prokoff et al. |
| 5,363,048 A | 11/1994 | Modlin et al. |
| 5,391,993 A | 2/1995 | Khazam et al. |
| 5,420,500 A | 5/1995 | Kerschner |
| 5,457,400 A | 10/1995 | Ahmad et al. |
| 5,498,964 A | 3/1996 | Kerschner et al. |
| 5,557,209 A | 9/1996 | Crook et al. |
| 5,623,211 A | 4/1997 | Lee |
| 5,712,570 A | 1/1998 | Heo et al. |
| 5,786,697 A | 7/1998 | Khazam et al. |
| 5,811,980 A | 9/1998 | Doyle et al. |
| 5,831,918 A | 11/1998 | Meritt et al. |
| 6,104,198 A | 8/2000 | Brooks |
| 6,144,210 A | 11/2000 | Brooks |
| 6,169,395 B1 | 1/2001 | King |
| 7,640,139 B2 * | 12/2009 | Sahara et al. ............ 702/183 |
| 2005/0068051 A1 | 3/2005 | Tesdahl et al. |

FOREIGN PATENT DOCUMENTS

| | | |
|---|---|---|
| CN | 101261302 | 9/2008 |
| JP | 03-028770 | 2/1991 |
| JP | 04-065683 | 3/1992 |
| JP | 08-233894 | 9/1996 |
| JP | 09-080107 | 3/1997 |
| JP | 2002-098728 | 4/2002 |
| JP | 2004-245709 | 9/2004 |
| WO | WO-2007/026603 A1 | 3/2007 |

* cited by examiner

*Primary Examiner* — Amy He
(74) *Attorney, Agent, or Firm* — Muncy, Geissler, Olds & Lowe, PLLC (57) ABSTRACT

An apparatus comprises a sensor, a power supply and a measurer. The sensor is placed over the electronic component. The power supply can supply electric power to the printed circuit; thereby the printed circuit is powered on. The measurer can measure a sensing signal through the sensor when the printed circuit is powered on.

12 Claims, 9 Drawing Sheets

APPARATUS FOR TESTING PRINTED CIRCUIT AND METHOD THEREFOR

BACKGROUND

1. Field of Invention

The present invention relates to a testing apparatus and a testing method. More particularly, the present invention relates to an apparatus and a method for testing a printed circuit or a printed circuit board assembly

2. Description of Related Art

A printed circuit board (PCB) populated with electronic components is a printed circuit assembly (PCA), also known as a printed circuit board assembly (PCBA). In other words, a printed circuit has a non-conductive substrate and electronic components, such as an active device, a passive device, a trace and so forth, where the trace etched from copper sheets laminated onto the non-conductive substrate acts as a conductive pathway that is electrically connected with the active device and/or the passive device. The non-conductive substrate is used to mechanically support the electronic components.

PCBs are rugged, inexpensive, and can be highly reliable. They require much more layout effort and higher initial cost than either wire-wrapped or point-to-point constructed circuits, but are much cheaper and faster for high-volume production.

It is important that the printed circuit having electronic components be tested after the components have been soldered to the printed circuit board. Several different approaches have been developed for testing the printed circuit having electronic components, such as visual inspection and automated optical inspection, while the power of the printed circuit is off. However, visual inspection and automated optical inspection is not so good for checking whether the printed circuit is correct.

For the foregoing reasons, there is a need for a new apparatus and method for testing the printed circuit or a printed circuit board assembly. The present disclosure meets this need.

SUMMARY

It is therefore an objective of the present invention to provide an apparatus for testing a printed circuit having at least one electronic component. In other words, the apparatus is capable of testing a printed circuit board assembly.

In accordance with an embodiment of the present invention, the apparatus comprises a sensor, a power supply and a measurer. The sensor is placed over the electronic component. The power supply can supply electric power to the printed circuit; thereby the printed circuit is powered on. The measurer can measure a sensing signal through the sensor when the printed circuit is powered on.

It is another objective of the present invention to provide a method for testing a printed circuit having at least one electronic component. In other words, the method is capable of testing a printed circuit board assembly.

In accordance with another embodiment of the method comprise following step:

(1) a sensor is placed over the electronic component;
(2) electric power is supplied to the printed circuit, thereby the printed circuit is powered on; and
(3) a sensing signal is measured through the sensor when the printed circuit is powered on.

It is to be understood that both the foregoing general description and the following detailed description are by examples, and are intended to provide further explanation of the invention as claimed.

BRIEF DESCRIPTION OF THE DRAWINGS

For a more complete understanding of the present invention, and the advantages thereof, reference is now made to the following descriptions taken in conjunction with the accompanying drawing, in which.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

One technical aspect of the present disclosure is an apparatus for testing a printed circuit. The apparatus may be easily inserted into existing device, and may be applicable or readily adaptable to all technology nodes.

Figure 1:
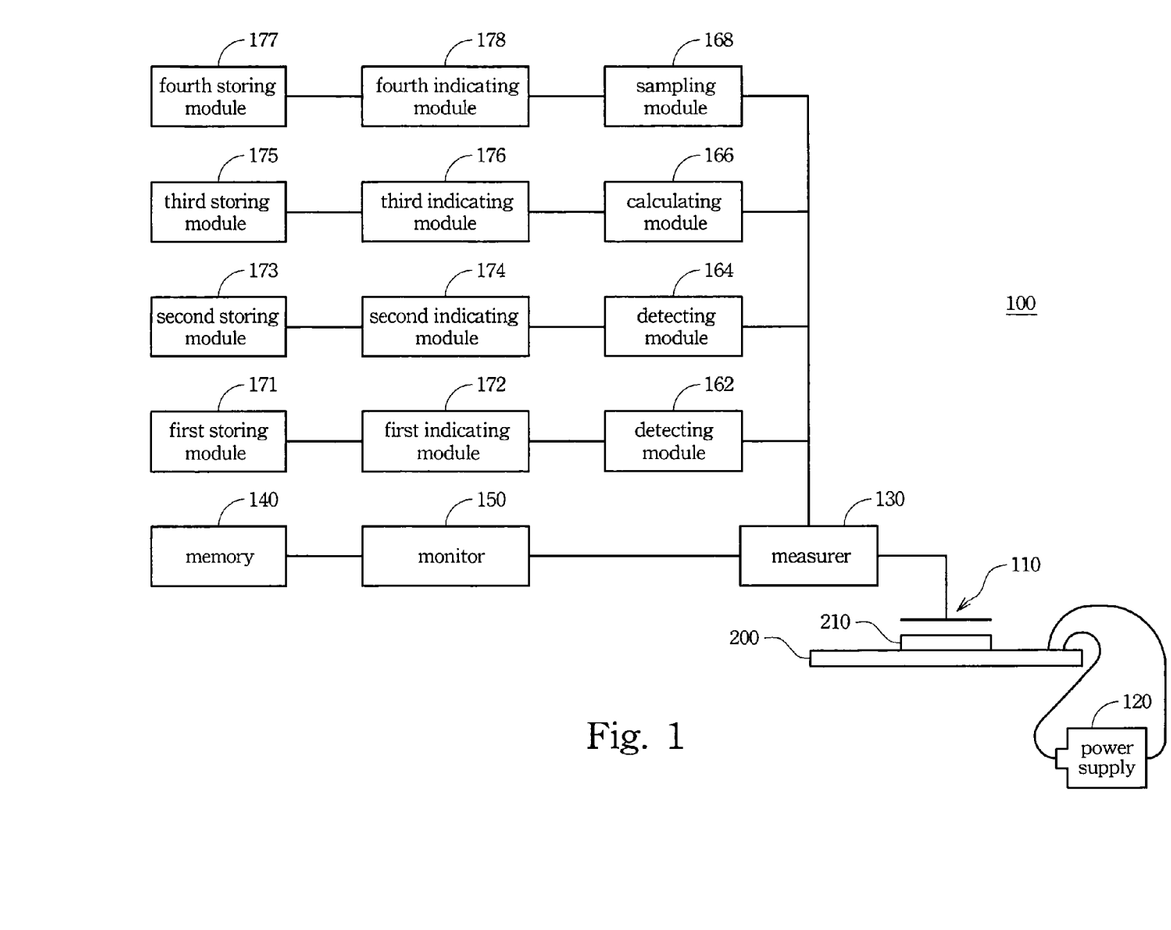
FIG. 1 is a schematic diagram of an apparatus according to an embodiment of the present invention.

Please refer to FIG. 1. FIG. 1 is a schematic diagram of an apparatus according to an embodiment of the present invention. The apparatus 100 can test a printed circuit 200 that has at least one electronic component 210. In the embodiment, the printed circuit 200 may be served as a printed circuit assembly, a printed circuit board assembly, or the like.

The electronic component 210 may be an active device, a passive device or a trace of the printed circuit 200. The active device may be MOS, BJT, etc. The passive device may be a resistor, a capacitor and an induction coil, etc. The trace acts as a conductive pathway, which is electrically connected with the active device and/or the passive device.

In the embodiment, the apparatus 100 comprises a sensor 110, a power supply 120 and a measurer 130. The sensor 110 is placed over the electronic component 210. The power supply 120 can supply electric power to the printed circuit 200; thereby the printed circuit 200 is powered on. The measurer 130 can measure a sensing signal through the sensor 120 when the printed circuit 200 is powered on.

Accordingly, the apparatus 100 can measure the sensing signal when the printed circuit 200 is powered on, and doesn't need any electrical probe accessed the printed circuit 200 for providing extra electrical signal to the electronic component 210.

Moreover, the printed circuit 200 may be electrically connected to a load, so that the electric current generated from the printed circuit 200 may output to the load. Additionally, the sensor 110 is placed over the electronic component 210. Therefore, the measurer 130 can measure a sensing signal when the printed circuit 200 that is electrically connected to the load is powered on, so as to response the state of the electronic component 210 distinctly. If the state of the electronic component 210 is abnormal, the electronic component 210 or another electronic component thereabouts has failed; on the contrary, if the state of the electronic component 210 is normal, the electronic component 210 and another electronic component thereabouts are normal.

If the sensor 110 is placed in a fixed position in proximity to the surface of the electronic component 210, characteristic impedance is generated between the sensor 110 and the electronic component 210 when the printed circuit 200 is powered on. Then, the sensor 110 can sense the sensing signal from the electronic component 210 via the characteristic impedance. The characteristic impedance may be a capacitance, a resistance and combinations thereof, or the like.

For a more complete understanding of the apparatus 100 to determine whether the electronic component 210 or another electronic component thereabouts is normal or failed. Please continue to refer to FIG. 1. The apparatus 100 may further comprise a memory 140 and a monitor 150. The memory 140 can preload a predetermined limit. The monitor 150 can indicate an error condition whenever the sensing signal is not within the predetermined limit.

Accordingly, the apparatus 100 can compare the sensing signal and the predetermined limit to determine whether the electronic component 210 or another electronic component thereabouts is normal or failed.

In the memory 140, the predetermined limit may include one or more coefficients of the normal sensing signal, such as a capacitive coupling coefficient, an electromagnetic coupling coefficient, a resistance coupling coefficient, combinations thereof, or the like. One of ordinary skill in the art will appreciate that the above examples are provided for illustrative purposes only to further explain applications of the present invention and are not meant to limit the present invention in any manner. Other coefficient may be used as appropriate for a given application.

For example, the printed circuit 200 may be a power circuit (ex: voltage regulator) that includes a PWM controller and metal-oxide-semiconductors (MOS), in which the electronic component 210 may be one MOS. When the power circuit is powered on, the PWM controller can modulate a square wave signal to drive the MOS. If the sensor 110 is placed in a fixed position in proximity to the surface of the MOS, characteristic impedance is generated between the sensor 110 and the MOS when driving the MOS. Then, the sensor 110 can sense the sensing signal from the MOS via the characteristic impedance. The sensing signal is sensed from summation of multiple pins of the electronic component 210, such as the gate, the drain and the source of the MOS. The frequency of the sensing signal depending on the PWM controller may be about 100 KHz~500 KHz. The level of the sensing signal may be about 0.1V~1V.

For measuring parameters of the sensing signal, please continue to refer to FIG. 1. The apparatus 100 may further comprise a detecting module 162, a detecting module 164, a calculating module 166 and a sampling module 168. The detecting module 162 can detect a peak-to-peak voltage from the sensing signal. The detecting module 164 can detect a duty ratio of the sensing signal. The calculating module 166 can calculate a root mean square voltage according to the sensing signal. The sampling module 168 can sample a waveform of the sensing signal.

Accordingly, the apparatus 100 can get the parameters of the sensing signal, such as the peak-to-peak voltage, the duty ratio and the root mean square voltage.

For one way of analyzing the state of the electronic component 210, please continue to refer to FIG. 1. The apparatus 100 may further comprise a first storing module 171 and a first indicating module 172. The first storing module 171 can preload a predetermined peak-to-peak voltage limit, such as digital data recording the range of the normal peak-to-peak voltage. The first indicating module 172 can indicate a first different state whenever the peak-to-peak voltage is not within the predetermined peak-to-peak voltage limit.

Accordingly, the apparatus 100 can analyze the state of the electronic component 210 by comparing the peak-to-peak voltage and the predetermined peak-to-peak voltage limit.

For another way of analyzing the state of the electronic component 210, please continue to refer to FIG. 1. The apparatus 100 may further comprises a second storing module 173 and a second indicating module 174. The second storing module 173 can preload a predetermined duty ratio limit, such as digital data recording the range of the normal duty ratio. The second indicating module 174 can indicate a second different state whenever the duty ratio is not within the predetermined duty ratio limit.

Accordingly, the apparatus 100 can analyze the state of the electronic component 210 by comparing the duty ratio and the predetermined duty ratio limit.

For example, the printed circuit 200 may be a power circuit, in which the electronic component 210 may be a high side MOS. The predetermined duty ratio limit may be about 10.75%. However, the duty ratio of the sensing signal is 3.97%, which signifies the high side MOS or another electronic component thereabouts may have failed.

For yet another way of analyzing the state of the electronic component 210, please continue to refer to FIG. 1. The apparatus 100 may further comprise a third storing module 175 and a third indicating module 176. The third storing module 175 can preload a predetermined root mean square voltage limit, such as digital data recording the range of the normal root mean square voltage. The third indicating module 176 can indicate a third different state whenever the root mean square voltage is not within the predetermined root mean square voltage limit.

Accordingly, the apparatus 100 can analyze the state of the electronic component 210 by comparing the root mean square voltage and the predetermined root mean square voltage limit.

For example, the printed circuit 200 may be a power circuit, in which the electronic component 210 may be a high side MOS. The predetermined root mean square voltage may be about 256 mV. However, the root mean square voltage of the sensing signal is 102 mV, which signifies the high side MOS or another electronic component thereabouts may have failed.

For yet another way of analyzing the state of the electronic component 210, please continue to refer to FIG. 1. The apparatus 100 may further comprise a fourth storing module 177 and a fourth indicating module 178. The fourth storing module 177 can preload a predetermined waveform limit, such as digital data recording the range of the normal waveform. The fourth indicating module 176 can indicate a fourth different state whenever the waveform is not within the predetermined waveform limit.

Accordingly, the apparatus 100 can analyze the state of the electronic component 210 by comparing the waveform of the sensing signal and the predetermined waveform limit.

More specifically, the fourth indicating module 176 may compare the waveform sampled by the sampling module 168 and the normal waveform preloaded in the fourth storing module 177 by means of pattern matching, numerical analysis or the like.

About above-mentioned pattern matching, the fourth indicating module 176 may examine the shape of the waveform sampled by the sampling module 168. Additionally, the fourth indicating module 176 may also examine the shape of the normal waveform preloaded in the fourth storing module 177. Therefore, the fourth indicating module 176 can determine whether the shape of the waveform match that of the normal waveform or not, to analyze the state of the electronic component 210.

For example, the shape of the normal waveform preloaded in the fourth storing module 177 may be drew as one square wave, and the shape of the waveform sampled by the sampling module 168 may be drew as another square wave with some wiggles, so that the shape of the waveform does not match that of the normal waveform, which signifies the electronic component 210 or another electronic component thereabouts may have failed.

About above-mentioned numerical analysis, the fourth indicating module 176 may calculate a Y-axis projection profile of the waveform sampled by the sampling module 168 and/or an X-axis projection profile sampled by the sampling module 168. Additionally, the fourth indicating module 176 may also calculate a normal Y-axis projection profile of the normal waveform preloaded in the fourth storing module 177 and/or a normal X-axis projection profile of the normal waveform preloaded in the fourth storing module 177. Therefore, the fourth indicating module 176 can contrast the Y-axis projection profile and the normal Y-axis projection profile, to analyze the state of the electronic component 210; alternatively, the fourth indicating module 176 can contrast the X-axis projection profile and the normal X-axis projection profile, to analyze the state of the electronic component 210.

For example, the normal Y-axis projection profile of the normal waveform preloaded in the fourth storing module 177 has 5 dots, and the Y-axis projection profile of the waveform sampled by the sampling module 168 has 11 dots, so that the Y-axis projection profile shall deeper than the normal Y-axis projection profile, which signifies the electronic component 210 or another electronic component thereabouts may have failed.

It should be noted that the sensor 110 might be coupled with the measurer 130 without through any negative feedback amplifier. In the control experiment, some defects are generated if the negative feedback amplifier is electrically connected with the sensor 110 or inserted into the sensor 110.

Figure 2A:
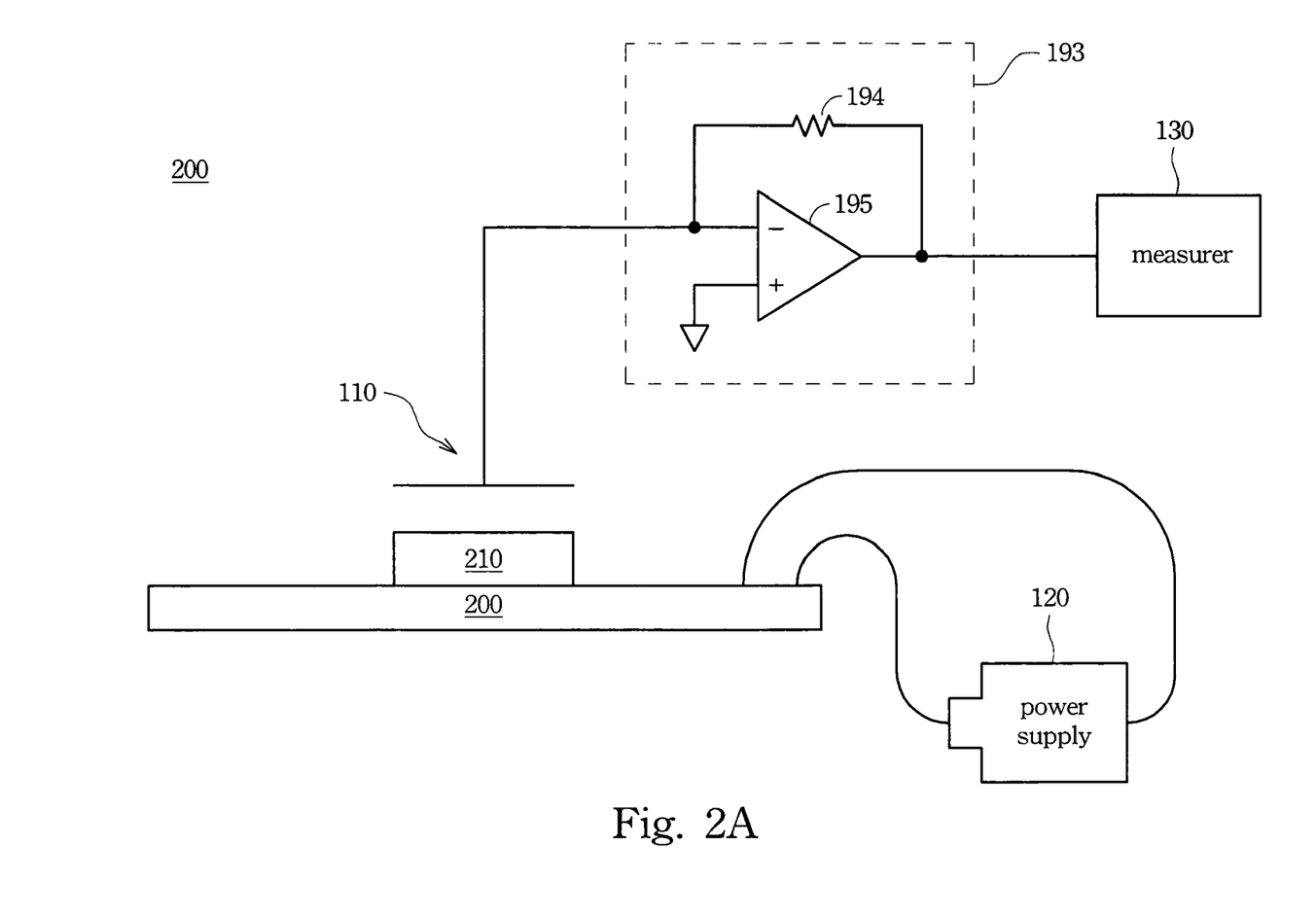
FIG. 2A shows another apparatus in the control experiment.

Please refer to FIG. 2A. FIG. 2A shows another apparatus, served as control group in the control experiment, for testing the printed circuit 200 having the electronic component 210. In FIG. 2A, the apparatus 200 comprises the sensor 110, the power supply 120, the negative feedback amplifier 193 and the measurer 130. The sensor 110 is coupled with the measurer 130 through the negative feedback amplifier 193. The negative feedback amplifier 193 comprises a feedback resistor 194 and an operational amplifier 195.

In this control experiment, a power circuit may be used as the printed circuit 200 that includes a PWM controller and metal-oxide-semiconductors (MOS), in which the electronic component 210 may be one MOS. The power supply 120 can supply electric power to the printed circuit 200; thereby the printed circuit 200 is powered on. When the power circuit is powered on, the PWM controller can modulate a square wave signal having complex frequency to drive the MOS. If the sensor 110 is placed in a fixed position in proximity to the surface of the MOS, characteristic impedance is generated between the sensor 110 and the MOS when driving the MOS. Then, the sensor 110 can sense the sensing signal from the MOS via the characteristic impedance, such as a capacitance and/or a resistance. The sensing signal is sensed from summation of multiple pins of the electronic component 210, such as the gate, the drain and the source of the MOS. The frequency of the sensing signal depending on the PWM controller may be about 100 KHz~500 KHz, i.e. the sensing signal having multiple frequencies is in accordance with the complex frequency of the square wave signal that may be about 100 KHz~500 KHz. The level of the sensing signal may be about 0.1V~1V. However, the negative feedback amplifier 193 is electrically coupled with the capacitance generated between the sensor 110 and the electronic component 210, which acts as a band pass filter. Therefore, the sensing signal having the complex frequency shall be distorted after it passes through the band pass filter, because the band pass filter may filter the low frequency wave and/or the high frequency wave of the sensing signal.

Figure 2B:
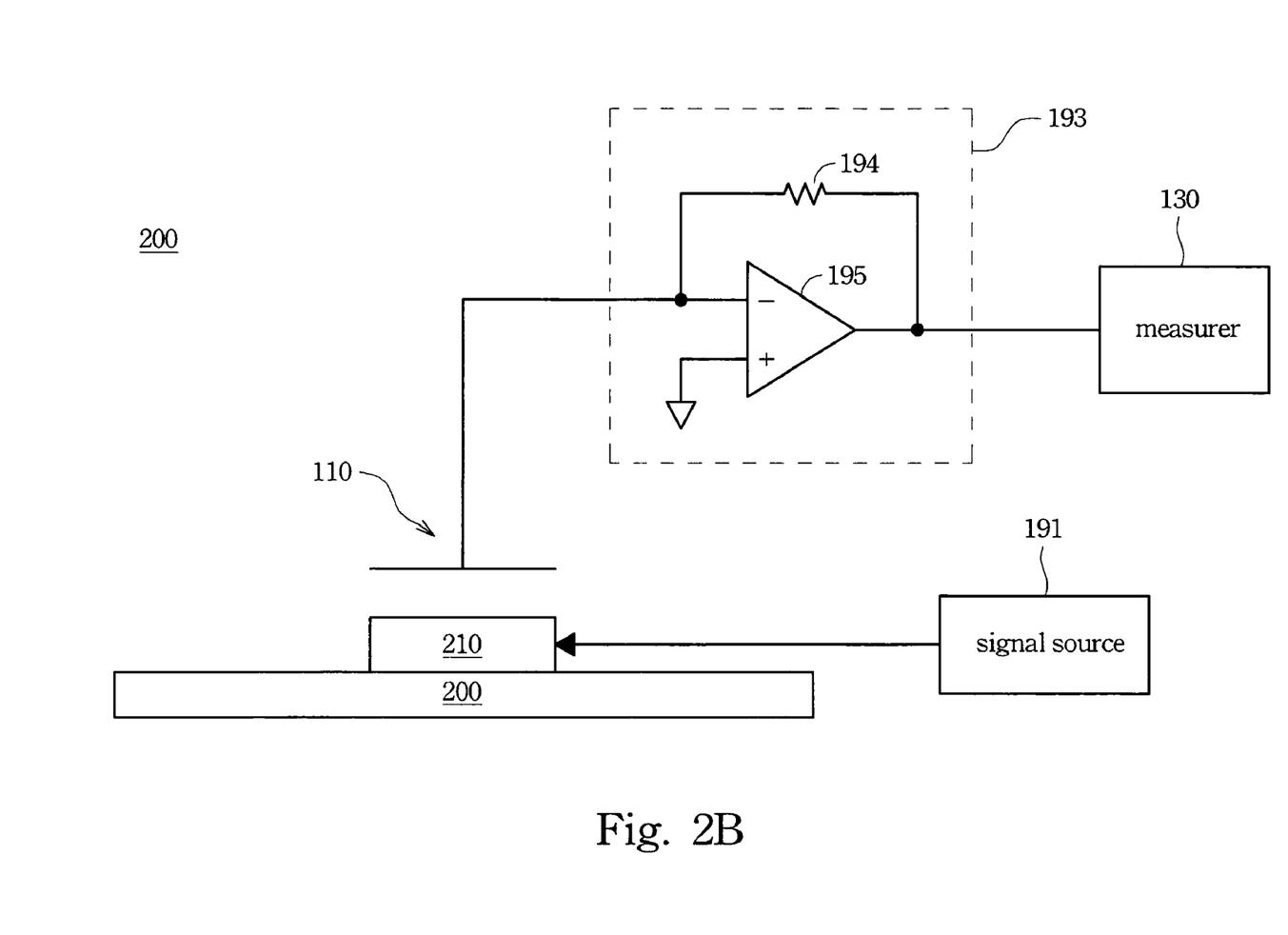
FIG. 2B shows yet another apparatus in the control experiment.

Accordingly, please refer to FIG. 2B. FIG. 2B shows yet another apparatus, served as control group in the control experiment, for testing the printed circuit 200 having the electronic component 210. In FIG. 2B, the apparatus 200 comprises the sensor 110, signal source 191, the negative feedback amplifier 193 and the measurer 130. The sensor 110 is coupled with the measurer 130 through the negative feedback amplifier 193. The negative feedback amplifier 193 comprises a feedback resistor 194 and an operational amplifier 195.

In this control experiment, a power circuit may be used as the printed circuit 200 that includes a PWM controller and metal-oxide-semiconductors (MOS), in which the electronic component 210 may be one MOS. The signal source 191 outputs a test signal having single frequency to stimulate the electronic component 210 when the power circuit is powered off. If the sensor 110 is placed in a fixed position in proximity to the surface of the MOS, characteristic impedance is generated between the sensor 110 and the MOS when stimulating the MOS. Then, the sensor 110 can sense the sensing signal from the MOS via the characteristic impedance, such as a capacitance and/or a resistance. The negative feedback amplifier 193 is electrically coupled with the capacitance generated between the sensor 110 and the electronic component 210, which acts as a band pass filter. Therefore, the sensing signal may be undistorted after it passes through the band pass filter if the single frequency of the sensing signal is set within the pass band of the band pass filter fortunately. However, the sensing signal may be rejected by the band pass filter if the single frequency of the sensing signal is not set within the pass band of the band pass filter unfortunately.

For a more complete mechanism of the sensor 110, and the advantages thereof, please refer to FIG. 3A, FIG. 3B, FIG. 4A and FIG. 4B. FIG. 3A, FIG. 3B, FIG. 4A and FIG. 4B show four lateral schematic drawings of the sensor 110 of FIG. 1 respectively.

Figure 3A:
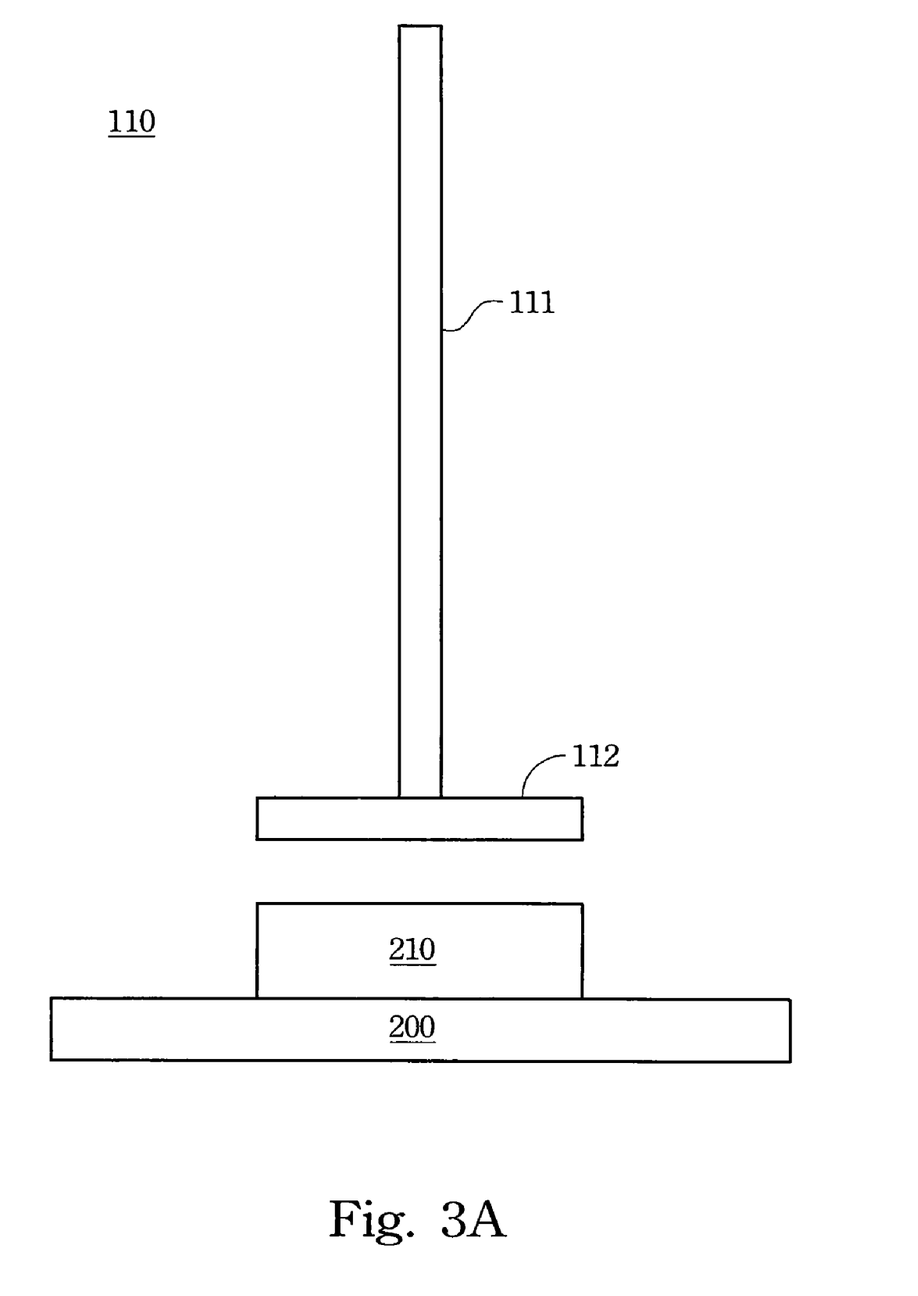
FIG. 3A, FIG. 3B, FIG. 4A and FIG. 4B show four lateral schematic drawings of the sensor of FIG. 1 respectively.

In FIG. 3A, the sensor 110 comprises a probe 111 and a printed circuit board 112. The printed circuit board 112 is electrically connected with the probe 111.

Accordingly, characteristic impedance, such as a capacitance, a resistance, combinations thereof, or the like, is generated between printed circuit board 112 and the electronic component 210 when the printed circuit 200 is powered on if the printed circuit board 112 is placed in a fixed position in proximity to the surface of the electronic component 210. Then, the probe 111 can conduct the sensing signal from the electronic component 210 via the characteristic impedance.

Figure 3B:
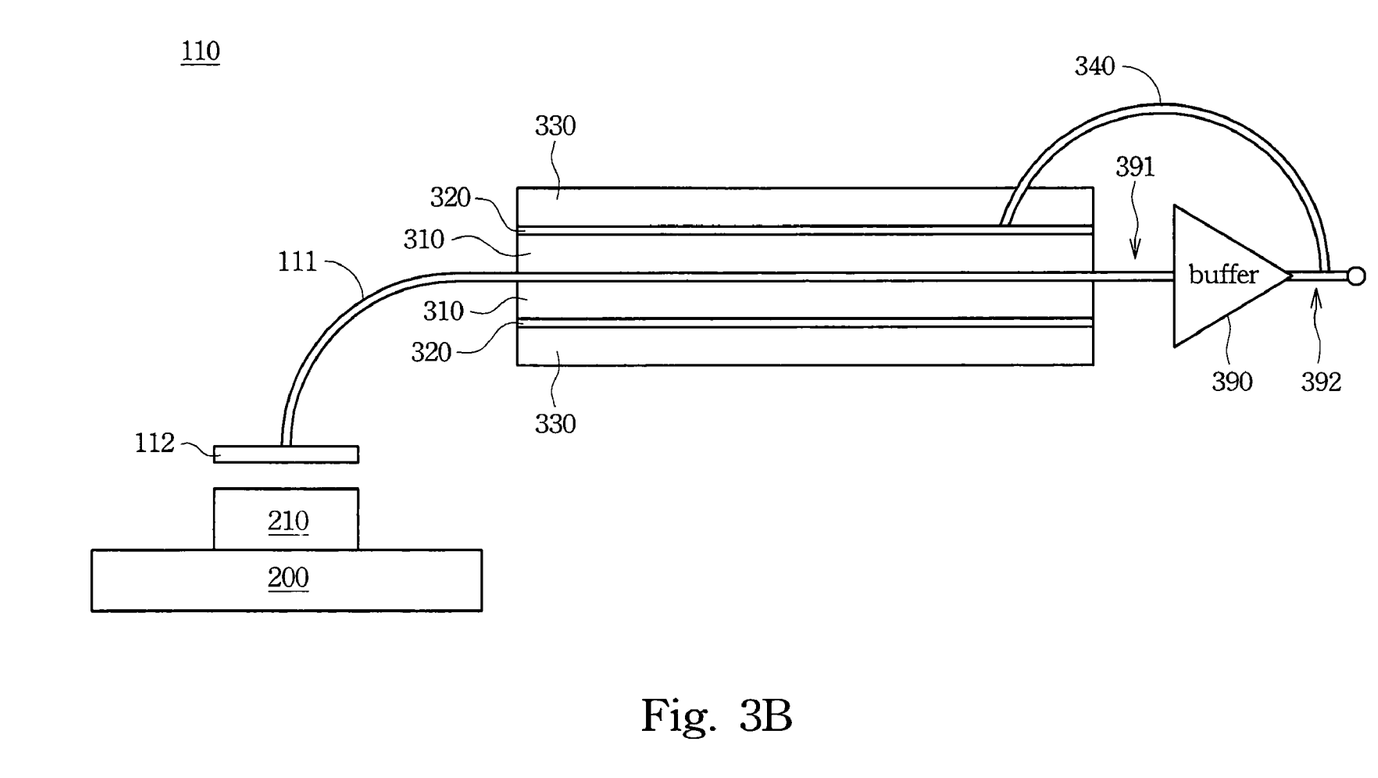

In FIG. 3B, the sensor 110 comprises a probe 111 and a printed circuit board 112. The printed circuit board 112 is electrically connected with the probe 111. Additionally, the sensor 110 further comprises a first insulating layer 310, a conductive layer 320, a second insulating layer 330, a signal buffer 390 and a conductive line 340. The signal buffer 390 includes an input terminal 391 and an output terminal 392, in which the input terminal 391 is electrically connected with the probe 111. The first insulating layer 310 surrounds the probe 111. The conductive layer 320 surrounds the first insulating layer 310. The second insulating layer 330 surrounds the conductive layer 320. The conductive line 340 is electrically connected with the conductive layer 320, for example, the conductive line 340 may pierce through the second insulating layer 330 to connect the conductive layer 320. The conductive layer 320 is coupled with the output terminal 392 via the conductive line 340.

Accordingly, characteristic impedance, such as a capacitance, a resistance, combinations thereof, or the like, is generated between printed circuit board 112 and the electronic component 210 when the printed circuit 200 is powered on if the printed circuit board 112 is placed in a fixed position in proximity to the surface of the electronic component 210. The probe 111 can conduct the sensing signal from the electronic component 210 via the characteristic impedance. The signal buffer 390 can improve the capability of driving the sensing signal while it is being moved from the input terminal 391 to the output terminal 392. The probe 111, the first insulating layer 310, the conductive layer 320 and the second insulating layer 330, which may act as a coaxial cable that provides protection of the sensing signal from external electromagnetic interference, and effectively guides the sensing signal with low loss along the length of the probe 111.

Additionally, the conductive layer 320 is coupled with the output terminal 392 via the conductive line 340, which can avoid the parasitic capacitance generated between the probe 111 and the conductive layer 320. In one control experiment, the conductive line 340 is abandoned and the conductive layer 320 is grounded, however, the parasitic capacitance may be generated between the probe 111 and the conductive layer 320 because of the electric potential difference between the probe 111 and the conductive layer 320.

Figure 4A:
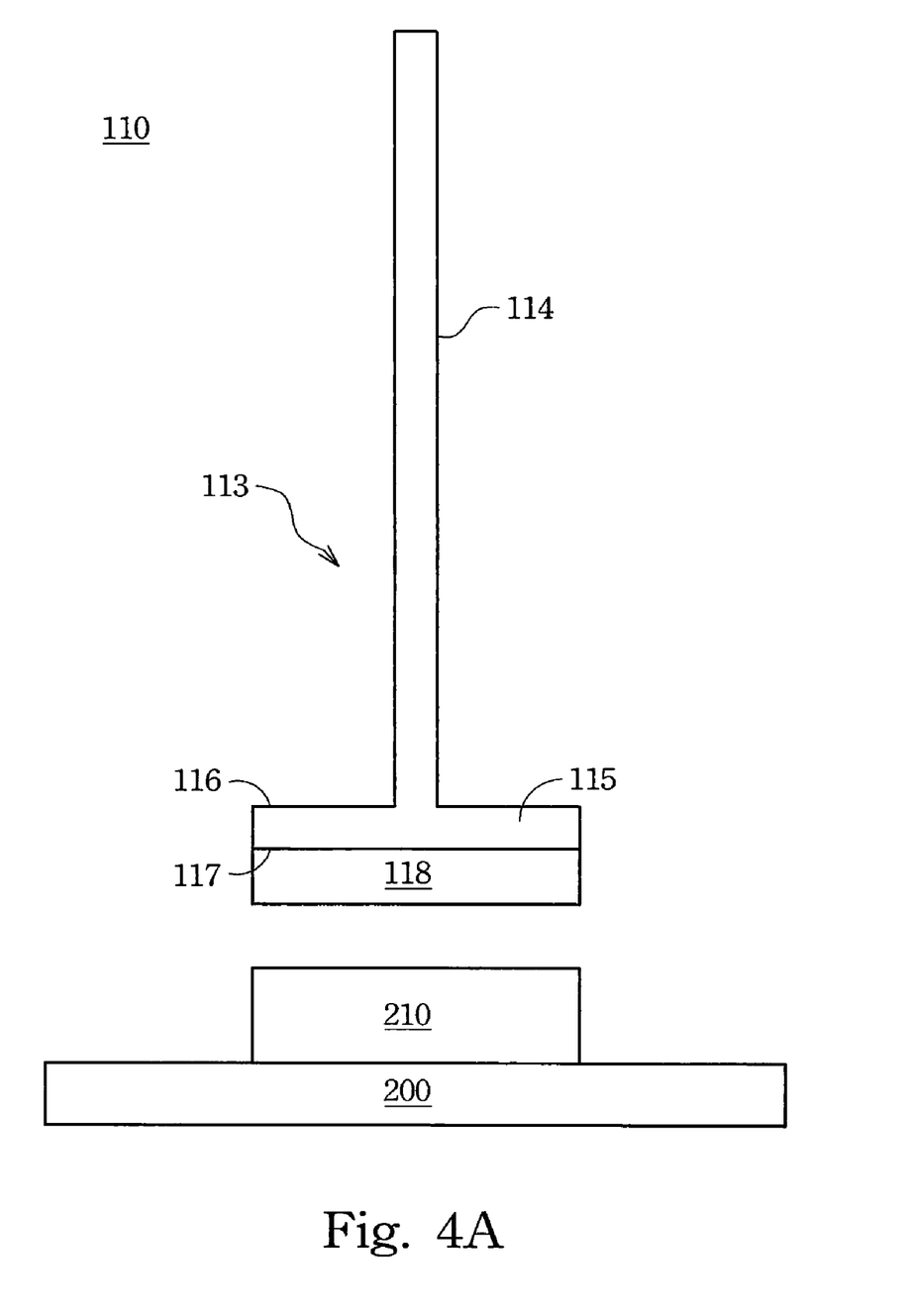

In FIG. 4A, the sensor 110 comprises a probe 113 and a dielectric medium 118. The probe 113 includes a wire 114 and a flat head 115. The flat head 115 has a first surface 116 and a second surface 117, where the first surface 116 is opposite to the second surface 117. The wire 114 is connected with the first surface 116 of the flat head 115. The dielectric medium 118 is located on the second surface 117 of the flat head 115.

Accordingly, characteristic impedance, such as a capacitance, a resistance, combinations thereof, or the like, is generated between the dielectric medium 118 and the electronic component 210 when the printed circuit 200 is powered on if the dielectric medium 118 is placed in a fixed position in proximity to the surface of the electronic component 210. Then, the probe 113 can conduct the sensing signal from the electronic component 210 via the characteristic impedance.

Figure 4B:
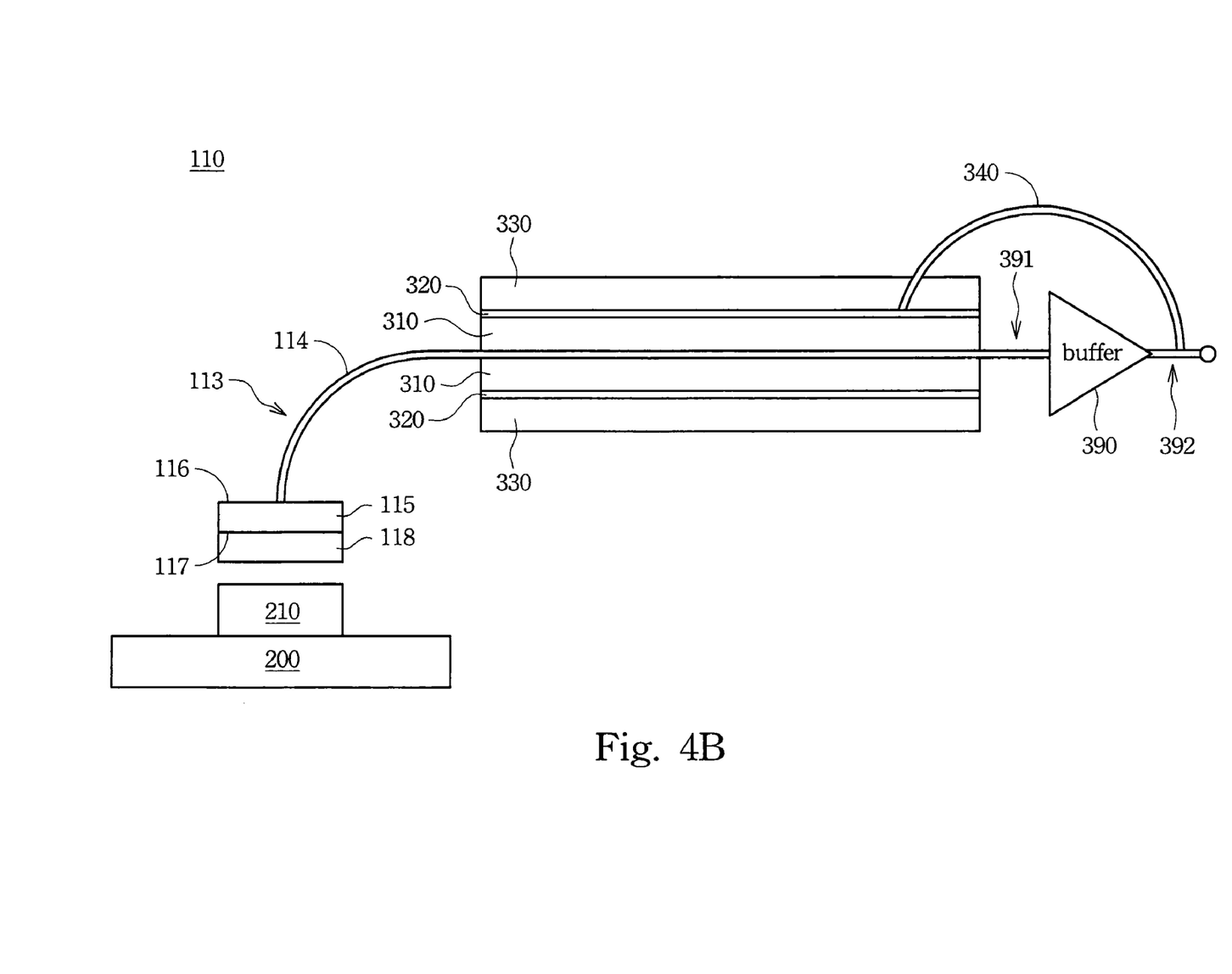

In FIG. 4B, the sensor 110 comprises a probe 113 and a dielectric medium 118. The probe 113 includes a wire 114 and a flat head 115. The flat head 115 has a first surface 116 and a second surface 117, where the first surface 116 is opposite to the second surface 117. The wire 114 is connected with the first surface 116 of the flat head 115. The dielectric medium 118 is located on the second surface 117 of the flat head 115. Additionally, the sensor 110 further comprises a first insulating layer 310, a conductive layer 320, a second insulating layer 330, a signal buffer 390 and a conductive line 340. The signal buffer 390 includes an input terminal 391 and an output terminal 392, in which the input terminal 391 is electrically connected with the wire 114. The first insulating layer 310 surrounds the wire 114. The conductive layer 320 surrounds the first insulating layer 310. The second insulating layer 330 surrounds the conductive layer 320. The conductive line 340 is electrically connected with the conductive layer 320; for example, the conductive line 340 may pierce through the second insulating layer 330 to connect the conductive layer 320. The conductive layer 320 is coupled with the output terminal 392 via the conductive line 340.

Accordingly, characteristic impedance, such as a capacitance, a resistance, combinations thereof, or the like, is generated between the dielectric medium 118 and the electronic component 210 when the printed circuit 200 is powered on if the dielectric medium 118 is placed in a fixed position in proximity to the surface of the electronic component 210. The probe 113 can conduct the sensing signal from the electronic component 210 via the characteristic impedance. The signal buffer 390 can improve the capability of driving the sensing signal while it is being moved from the input terminal 391 to the output terminal 392. The wire 114, the first insulating layer 310, the conductive layer 320 and the second insulating layer 330, which may act as a coaxial cable that provides protection of the sensing signal from external electromagnetic interference, and effectively guides the sensing signal with low loss along the length of the wire 114.

Additionally, the conductive layer 320 is coupled with the output terminal 392 via the conductive line 340, which can avoid the parasitic capacitance generated between the wire 114 and the conductive layer 320. In one control experiment, the conductive line 340 is abandoned and the conductive layer 320 is grounded, however, the parasitic capacitance may be generated between the wire 114 and the conductive layer 320 because of the electric potential difference between the wire 114 and the conductive layer 320.

Another technical aspect of the present disclosure is a method for testing a printed circuit. The method may be easily inserted into existing device, and may be applicable or readily adaptable to all technology nodes.

Figure 5:
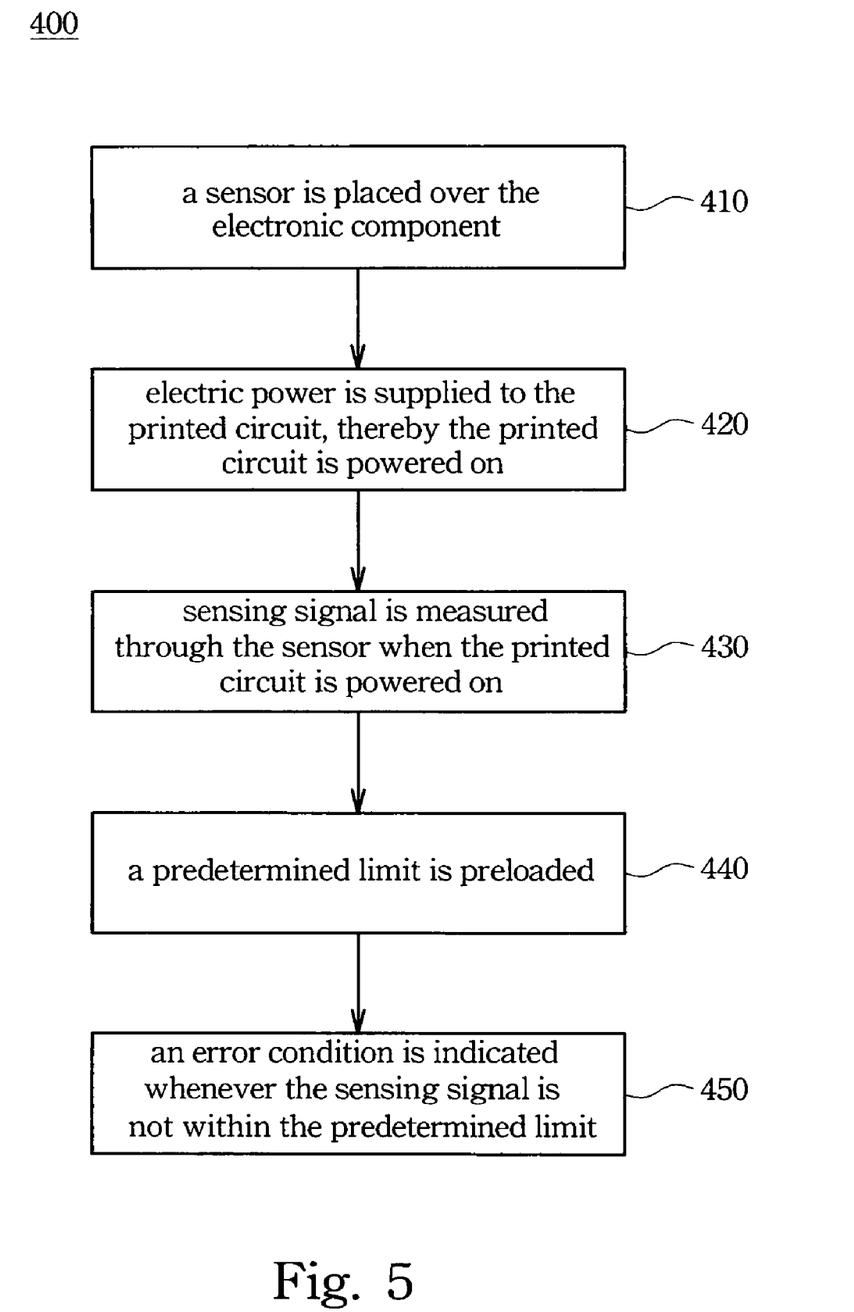
FIG. 5 is a flow chart of a method 400 according to an embodiment of the present invention.

Please refer to FIG. 5. FIG. 5 is a flow chart of a method according to an embodiment of the present invention. The method 400 can test a printed circuit 200 that has at least one electronic component. In the embodiment, the printed circuit 200 may be served as a printed circuit assembly, a printed circuit board assembly, or the like.

The electronic component may be an active device, a passive device or a trace of the printed circuit. The active device may be MOS, BJT, etc. The passive device may be a resistor, a capacitor and an induction coil, etc. The trace acts as a conductive pathway, which is electrically connected with the active device and/or the passive device.

In the embodiment, the method 400 comprises:

(Step 410) a sensor is placed over the electronic component;

(Step 420) electric power is supplied to the printed circuit, thereby the printed circuit is powered on; and (Step 430) a sensing signal is measured through the sensor when the printed circuit is powered on.

In the method 400, it should be noted that one step might be performed in series, in parallel, in combination, or otherwise in conjunction with another if the specific order is not described or inferred in the embodiment.

Accordingly, the method 400 can measure the sensing signal when the printed circuit is powered on, and doesn't need any electrical probe accessed the printed circuit for providing extra electrical signal to the electronic component.

Moreover, the printed circuit may be electrically connected to a load, so that the electric current generated from the printed circuit may output to the load. Additionally, the sensor is placed over the electronic component. Therefore, the measurer can measure a sensing signal when the printed circuit that is electrically connected to the load is powered on, so as to response the state of the electronic component distinctly. If the state of the electronic component is abnormal, the electronic component or another electronic component thereabouts has failed; on the contrary, if the state of the electronic component is normal, the electronic component and another electronic component thereabouts are normal.

If the sensor is placed in a fixed position in proximity to the surface of the electronic component, characteristic impedance is generated between the sensor and the electronic component when the printed circuit is powered on. Then, the sensor can sense the sensing signal from the electronic component via the characteristic impedance. The characteristic impedance may be a capacitance, a resistance and combinations thereof, or the like.

For a more complete understanding of the method 400 to determine whether the electronic component or another electronic component thereabouts is normal or failed. Please continue to refer to FIG. 5. The method 400 may further comprise:

(Step 440) a predetermined limit is preloaded; and (Step 450) an error condition is indicated whenever the sensing signal is not within the predetermined limit.

Accordingly, the method 400 can compare the sensing signal and the predetermined limit to determine whether the electronic component or another electronic component thereabouts is normal or failed.

The predetermined limit may include one or more coefficients of the normal sensing signal, such as a capacitive coupling coefficient, an electromagnetic coupling coefficient, a resistance coupling coefficient, combinations thereof, or the like. One of ordinary skill in the art will appreciate that the above examples are provided for illustrative purposes only to further explain applications of the present invention and are not meant to limit the present invention in any manner. Other coefficient may be used as appropriate for a given application.

For example, the printed circuit may be a power circuit (ex: voltage regulator) that includes a PWM controller and metal-oxide-semiconductors (MOS), in which the electronic component may be one MOS. When the power circuit is powered on, the PWM controller can modulate a square wave signal to drive the MOS. If the sensor 110 is placed in a fixed position in proximity to the surface of the MOS, characteristic impedance is generated between the sensor 110 and the MOS when driving the MOS. Then, the sensor 110 can sense the sensing signal from the MOS via the characteristic impedance. The sensing signal is sensed from summation of multiple pins of the electronic component, such as the gate, the drain and the source of the MOS. The frequency of the sensing signal depended on the PWM controller may be about 100 KHz~500 KHz. The level of the sensing signal may be about 0.1V~1V.

Figure 6:
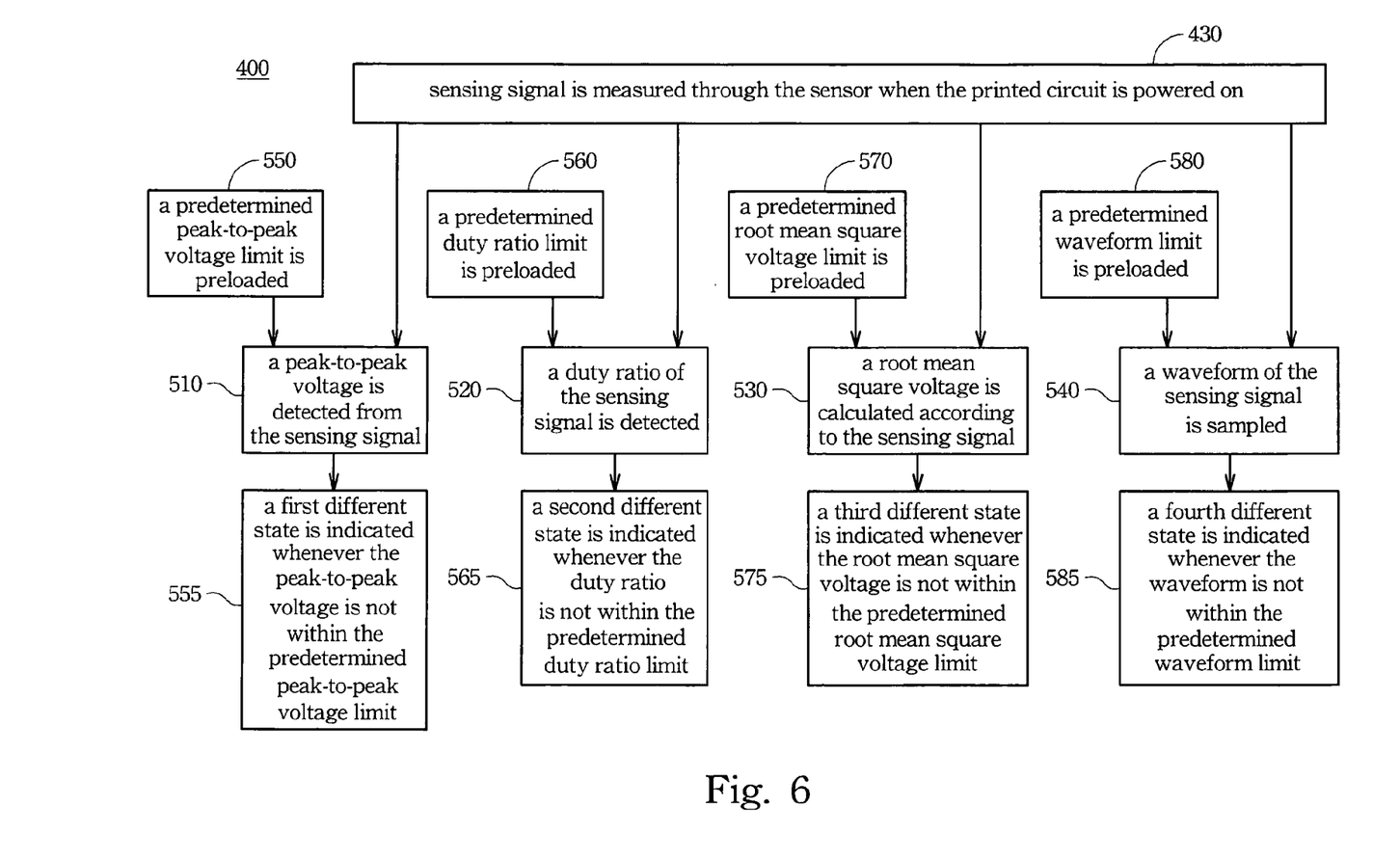
FIG. 6 shows another flow chart of the method 400.

For measuring parameters of the sensing signal, please refer to FIG. 6. FIG. 6 shows other steps of the method 400 of FIG. 4. The method 400 may further comprise:

(Step 510) a peak-to-peak voltage is detected from the sensing signal;

(Step 520) a duty ratio of the sensing signal is detected;

(Step 530) a root mean square voltage is calculated according to the sensing signal; and (Step 540) a waveform of the sensing signal is sampled.

Accordingly, the method 400 can get the parameters of the sensing signal, such as the peak-to-peak voltage, the duty ratio and the root mean square voltage.

For one way of analyzing the state of the electronic component, please continue to refer to FIG. 6. The method 400 may further comprise:

(Step 550) a predetermined peak-to-peak voltage limit is preloaded, such as digital data recording the range of the normal peak-to-peak voltage; and (Step 555) a first different state is indicated whenever the peak-to-peak voltage is not within the predetermined peak-to-peak voltage limit.

Accordingly, the method 400 can analyze the state of the electronic component 210 by comparing the peak-to-peak voltage and the predetermined peak-to-peak voltage limit.

For another way of analyzing the state of the electronic component, please continue to refer to FIG. 6. The method 400 may further comprise:

(Step 560) a predetermined duty ratio limit is preloaded, such as digital data recording the range of the normal duty ratio; and (Step 565) a second different state is indicated whenever the duty ratio is not within the predetermined duty ratio limit.

Accordingly, the method 400 can analyze the state of the electronic component by comparing the duty ratio and the predetermined duty ratio limit.

For example, the printed circuit may be a power circuit, in which the electronic component may be a high side MOS. The predetermined duty ratio limit may be about 10.75%. However, the duty ratio of the sensing signal is 3.97%, which signifies the high side MOS or another electronic component thereabouts may have failed.

For yet another way of analyzing the state of the electronic component, please continue to refer to FIG. 6. The method 400 may further comprise:

(Step 570) a predetermined root mean square voltage limit is preloaded, such as digital data recording the range of the normal root mean square voltage; and (Step 575) a third different state is indicated whenever the root mean square voltage is not within the predetermined root mean square voltage limit.

Accordingly, the method 400 can analyze the state of the electronic component by comparing the root mean square voltage and the predetermined root mean square voltage limit.

For example, the printed circuit may be a power circuit, in which the electronic component may be a high side MOS. The predetermined root mean square voltage may be about 256 mV. However, the root mean square voltage of the sensing signal is 102 mV, which signifies the high side MOS or another electronic component thereabouts may have failed.

For yet another way of analyzing the state of the electronic component, please continue to refer to FIG. 6. The method 400 may further comprise:

(Step 580) a predetermined waveform limit is preloaded, such as digital data recording the range of the normal waveform; and (Step 585) a fourth different state is indicated whenever the waveform is not within the predetermined waveform limit.

Accordingly, the method 400 can analyze the state of the electronic component by comparing the waveform and the waveform limit.

More specifically, in step 585, the sampled waveform and the preloaded normal waveform may be compared by means of pattern matching, numerical analysis or the like.

About above-mentioned pattern matching, in step 585, the shape of the waveform sampled in step 540 may be examined. Additionally, the shape of the normal waveform preloaded in step 580 may be examined. Therefore, whether the shape of the waveform match that of the normal waveform or not may be determined in step 585, to analyze the state of the electronic component 210.

For example, the shape of the normal waveform preloaded in step 580 may be drew as one square wave, and the shape of the waveform sampled in step 540 may be drew as another square wave with some wiggles, so that the shape of the waveform does not match that of the normal waveform, which signifies the electronic component or another electronic component thereabouts may have failed.

About above-mentioned numerical analysis, in step 585, a Y-axis projection profile of the waveform that is sampled in step 540 is calculated and/or an X-axis projection profile that is sampled in step 540 is calculated. Additionally, in step 585, a normal Y-axis projection profile of the normal waveform that is preloaded in step 580 is calculated and/or a normal X-axis projection profile of the normal waveform that is preloaded in step 580 is calculated. Therefore, in step 585, the Y-axis projection profile and the normal Y-axis projection profile are contrasted, to analyze the state of the electronic component; alternatively, the X-axis projection profile and the normal X-axis projection profile are contrasted, to analyze the state of the electronic component.

For example, in step 585, the normal Y-axis projection profile of the normal waveform that is preloaded in step 580 has 5 dots, and the Y-axis projection profile of the waveform sampled in step 540 has 11 dots, so that the Y-axis projection profile shall deeper than the normal Y-axis projection profile, which signifies the electronic component or another electronic component thereabouts may have failed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for testing a power circuit including at least one metal-oxide-semiconductor (MOS), the apparatus comprising:
   a sensor placed over the MOS;
   a power supply for supplying electric power to the power circuit, so that the power circuit is powered on and the MOS is driven;
   a measurer for measuring a sensing signal corresponding to a state of the MOS through the sensor when the power circuit is powered on;
   a detecting module for detecting a peak-to-peak voltage from the sensing signal corresponding to the state of the MOS;
   another detecting module for detecting a duty ratio of the sensing signal corresponding to the state of the MOS;
   a calculating module for calculating a root mean square voltage according to the sensing signal corresponding to the state of the MOS; and
   a sampling module for sampling a waveform of the sensing signal corresponding to the state of the MOS.

2. The apparatus as claimed in claim 1, further comprising:
   a memory for preloading a predetermined limit; and
   a monitor for indicating an error condition whenever the sensing signal is not within the predetermined limit.

3. The apparatus as claimed in claim 1, further comprising:
   a first storing module for preloading a predetermined peak-to-peak voltage limit; and
   a first indicating module for indicating a first different state whenever the peak-to-peak voltage is not within the predetermined peak-to-peak voltage limit.

4. The apparatus as claimed in claim 3, further comprising:
   a second storing module for preloading a predetermined duty ratio limit; and
   a second indicating module for indicating a second different state whenever the duty ratio is not within the predetermined duty ratio limit.

5. The apparatus as claimed in claim 4, further comprising:
   a third storing module for preloading a predetermined root mean square voltage limit; and
   a third indicating module for indicating a third different state whenever the root mean square voltage is not within the predetermined root mean square voltage limit.

6. The apparatus as claimed in claim 5, further comprising:
   a fourth storing module for preloading a predetermined waveform limit; and
   a fourth indicating module for indicating a fourth different state whenever the waveform is not within the predetermined waveform limit.

7. A method for testing a power circuit including at least one metal-oxide-semiconductor (MOS) the method comprising:
   placing a sensor over the MOS;
   supplying electric power to the power circuit, so that the power circuit is powered on and the MOS is driven;
   measuring a sensing signal corresponding to a state of the MOS through the sensor when the power circuit is powered on;
   detecting a peak-to-peak voltage from the sensing signal corresponding to the state of the MOS;
   detecting a duty ratio of the sensing signal corresponding to the state of the MOS;
   calculating a root mean square voltage according to the sensing signal corresponding to the state of the MOS; and
   sampling a waveform of the sensing signal corresponding to the state of the MOS.

8. The method as claimed in claim 7, further comprising:
   preloading a predetermined limit; and
   indicating an error condition whenever the sensing signal is not within the predetermined limit.

9. The method as claimed in claim 7, further comprising:
   preloading a predetermined peak-to-peak voltage limit; and
   indicating a first different state whenever the peak-to-peak voltage is not within the predetermined peak-to-peak voltage limit.

10. The method as claimed in claim 7, further comprising:
    preloading a predetermined duty ratio limit; and
    indicating a second different state whenever the duty ratio is not within the predetermined duty ratio limit.

11. The method as claimed in claim 7, further comprising:
    preloading a predetermined root mean square voltage limit; and
    indicating a third different state whenever the root mean square voltage is not within the predetermined root mean square voltage limit.

12. The method as claimed in claim 7, further comprising:
    preloading a predetermined waveform limit; and
    indicating a fourth different state whenever the waveform is not within the predetermined waveform limit.

* * * * *